United States Patent [19]

Phy

[11] Patent Number: 4,688,075
[45] Date of Patent: Aug. 18, 1987

[54] INTEGRATED CIRCUIT HAVING A PRE-ATTACHED CONDUCTIVE MOUNTING MEDIA AND METHOD OF MAKING THE SAME

[75] Inventor: William S. Phy, Los Altos Hills, Calif.

[73] Assignee: Fairchild Semiconductor Corporation, Cupertino, Calif.

[21] Appl. No.: 516,019

[22] Filed: Jul. 22, 1983

[51] Int. Cl.⁴ .............................................. H01L 39/02
[52] U.S. Cl. ..................................... 357/80; 228/123; 437/180
[58] Field of Search ................... 357/74, 81, 82, 70, 357/80; 228/123, 159, 160, 188; 29/590, 591, 589, 583, 739, 740; 428/620, 621, 624, 625, 626, 634, 673

[56] References Cited

U.S. PATENT DOCUMENTS

| | | | |
|---|---|---|---|
| 3,978,578 | 9/1976 | Murphy | 29/590 |
| 4,078,711 | 3/1978 | Bell et al. | 228/123 |
| 4,293,587 | 10/1981 | Trueblood | 29/590 |
| 4,390,598 | 6/1983 | Phy | 428/577 |
| 4,423,548 | 1/1984 | Hulseweh | 29/591 |
| 4,451,971 | 6/1984 | Milgram | 29/591 |
| 4,451,972 | 6/1984 | Batinovich | 29/583 |
| 4,485,553 | 12/1984 | Christian et al. | 29/589 |

FOREIGN PATENT DOCUMENTS

| | | | |
|---|---|---|---|
| 833197 | 1/1970 | Canada | 357/16 |
| 1206759 | 9/1970 | United Kingdom . | |
| 2084399 | 4/1982 | United Kingdom . | |

Primary Examiner—William L. Sikes
Assistant Examiner—Frank González
Attorney, Agent, or Firm—Stephen J. Phillips; David H. Carroll; James M. Heslin

[57] ABSTRACT

A semiconductor wafer having a plurality of integrated circuits is provided. One surface of the wafer includes a plurality of electrical contacts on the circuits which are subsequently attached to leads. The other surface of the wafer is provided with a conductive tape. The wafer is cut, e.g., sawed, resulting in each individual circuit having a pre-attached conductive mounting media. The individual circuits can then be attached to a substrate through the conductive mounting media. Other embodiments are disclosed.

19 Claims, 11 Drawing Figures

INTEGRATED CIRCUIT HAVING A PRE-ATTACHED CONDUCTIVE MOUNTING MEDIA AND METHOD OF MAKING THE SAME

BACKGROUND OF THE INVENTION

The present invention relates generally to packages for integrated circuits, and more particularly to such packages in which a surface of the integrated circuit is provided with a pre-attached conductive mounting media.

In the manufacture of integrated circuits, wafers containing many separate integrated circuits are fabricated and then cut into individual circuits, often individually referred to as die. Each die is individually packaged, using any one of a variety of known techniques. During packaging, electrically conductive leads are attached to electrical contacts of the die by well known techniques, such as wire bonding or tape automated bonding. A particularly desirable lead attachment technique is disclosed in my copending application of Ser. No. 365,686, filed Apr. 5, 1982, now U.S. Pat. No. 4,390,598, entitled "Lead Format For Tape Automated Bond", assigned to the assignee of the current application and hereby incorporated by reference. After the assembly of the die and the conductive leads is completed, the resulting assembly is then usually encapsulated in epoxy or some other enclosure for protection.

Referring more particularly to the typical die, one surface of the die includes a plurality of the electrical contacts to which these leads are attached while the opposing surface of the die is generally conductively bonded to a substrate by conventional means. For example, as described in my previously mentioned copending patent application, one technique is to employ a thin layer of conductive polymide paste placed on the substrate and then apply heat to cure the paste and attach the die to the substrate. Thus, although the electrical connections necessary on one side of the die can be made simply and in an automated fashion, the steps involved in attaching the die to the substrate, often referred to as die-attach, are not easily automated. In this connection, it has been found that, in addition to presenting risk of failure, the steps of dispensing and applying liquid or paste are difficult to automate.

Accordingly, it is a general object of this invention to provide an improved die-attach method and structures made by such method.

Another object of the present invention is to provide such a die-attach method which avoids problems associated with the steps involved in the use of paste or liquid die-attach media.

Another object of this invention is to provide a die-attach method which can be automated.

SUMMARY OF THE INVENTION

In one form of the invention, a method is provided for attaching a conductive mounting media to an integrated circuit. The method includes a step of providing a semiconductor wafer including a plurality of integrated circuits therein. The wafer has a pair of opposing major surfaces with one of the surfaces including a plurality of electrical contacts for each of the integrated circuits. The method includes the step of attaching the other of the major surfaces of the wafer to a first surface of an electrically conductive tape. The method includes the step of separating individual ones of the integrated circuits, wherein each of the individual ones includes the conductive mounting media attached thereto with the media comprising a portion of the electrically conductive tape.

BRIEF DESCRIPTION OF THE DRAWINGS

For better understanding of the invention, reference may be had to the following description, taken in conjunction with the accompanying drawings, wherein.

DETAILED DESCRIPTION

Figure 1:
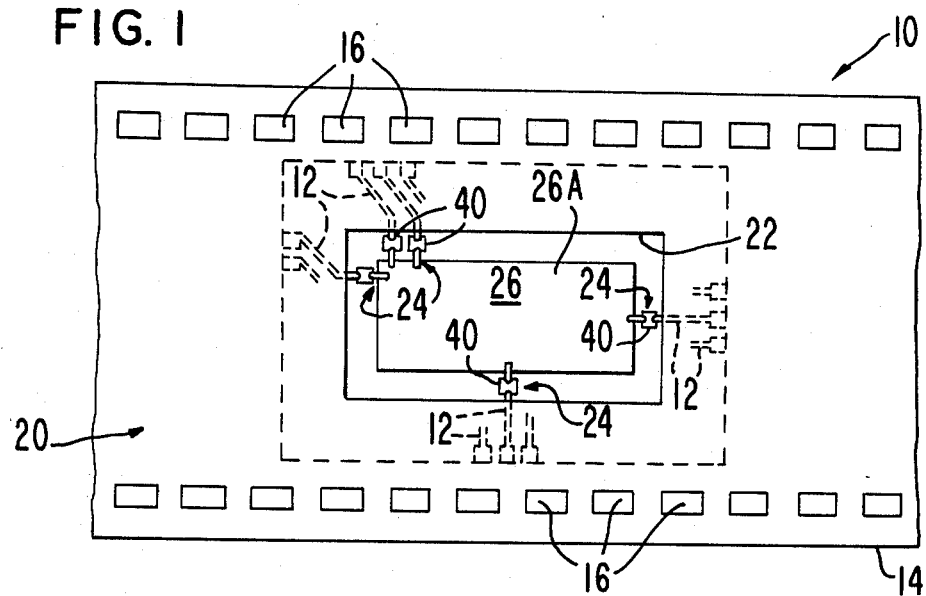
FIG. 1 is a view of a tape comprising a carrier film having leads positioned above an integrated circuit prior to attaching the integrated circuit to a substrate.

Referring to FIG. 1, a tape 10 comprises a plurality of electrically-conductive leads 12 laminated to the underside (as viewed in FIG. 1) of a carrier film 14. The leads 12 are typically formed from copper, and conventional circuit board processes are used to etch a copper layer laminated to the film 14 into the desired pattern of leads. The film 14 is typically formed from glass fiber or a synthetic polymer. It is desirable that the polymer be heat and chemical resistant to withstand the various processing steps required in formation of the tape and connection of the leads 12 to electrical contacts on a surface 26A of an integrated circuit 26. Preferred polymers include Mylar° (polyester), and polyvinyl chloride. Particularly preferred are polyimides. The film 14 includes sprocket holes 16 along both edges for use in advancement and registration of the film.

The tape 10 includes a plurality of frames 20 defined by a central opening 22 penetrating the carrier film 14 at a location typically mid-way between the edges. The frame 20 is further defined by the plurality of leads 12 which encompass the periphery of the opening 22, each extending inward a short distance into the opening. As will be described in more detail hereinafter, the portion 24 of each lead 12 which extends into the opening 22 is eventually bonded to the electrical contacts of integrated circuit die 26 when the die is brought into position beneath the opening 22.

Referring to FIGS. 2A–2D, the opposing surface 26B of the integrated circuit die 26 is attached to a substrate 28 in a multi-step operation, as will now be described.

Figure 2A:
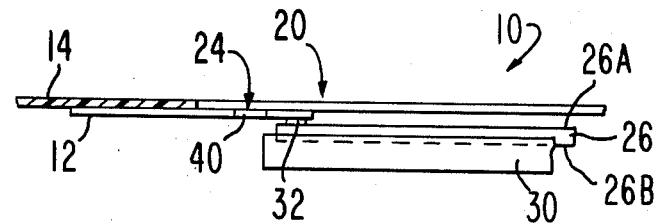
FIGS. 2A–2D are partial elevational views illustrating one form of the present invention in which the integrated circuit shown in FIG. 1 is attached to the substrate.

Initially, the integrated circuit 26 is held in a wax form 30, as illustrated in FIG. 2A. The integrated circuit 26 is brought into contact with the tape 10 at the appropriate frame 20 so that the outer portions 24 of the leads 12 contact bumps 32 formed on the upper surface 26A (as viewed in the Drawings) of the circuit 26. Although only a single lead 12 and bump 32 are illustrated in FIGS. 2A–2D, it is to be understood that the surface 26A of the integrated circuit 26 includes a plurality of bumps 32 corresponding to the number of electrical contacts in the particular integrated circuit, and that for the most part each bump 32 will have a corresponding electrical lead 12 to which it will be attached. The bumps 32 are typically formed from a gold/tin alloy which may be thermally bonded to the leads 12 in a conventional manner, typically by thermocompression, ultrasonic, eutectic or reflow solder techniques. The heat from the bonding will melt the wax form 30 and allow the tape 10 to carry the die 26 upward and away.

After the contacts on the surface 26A of the integrated circuit 26 have been bonded to the leads 12, and before the circuit is attached to the substrate 28 in accordance with one form of the present invention, the circuit may be tested by a conventional techniques. Testing at this stage of assembly is particularly convenient since the circuits are still mounted on the tape and may be sequentially screened as part of the assembly procedure. Moreover, the circuits have been bonded to the lead frame and any damage which may have resulted from such handling and bonding will be uncovered in the screening.

Figure 2B:
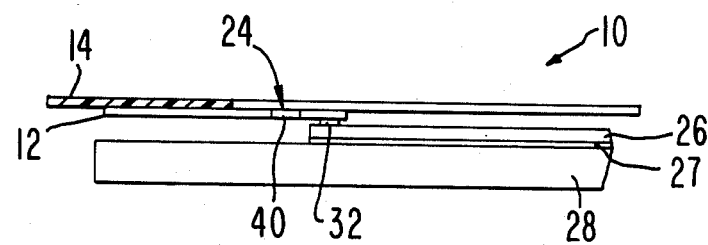

After the integrated circuit 26 has been tested and found functional, the surface 26B of the circuit 26 is attached to the substrate 28 to form a conventional package. Exemplary materials for the substrate 28 include electrical insulators, e.g., aluminum oxide, beryllium oxide, as well as electrical conductors, e.g., metals and alloys, such as copper alloys, KOVAR TM. As shown in FIG. 2B, the circuit 26 is brought into position so that it lies adjacent the proper position on the substrate 28 and is attached thereto. In accordance with one form of the present invention, the surface 26B of the integrated circuit 26 is provided with a pre-attached conductive mounting media 27 which is preferably in the form of a solid material. The media 27 preferably has a thickness from about 0.5 mils to 3.0 mils. Preferred materials for the conductive mounting media 27 include polymides, particularly polymides having a noble metal, e.g., silver, content such that the media 27 exhibits, or can be altered to exhibit an electrical resistivity of less than 100 m ohm/square.

Then, the entire assembly shown in FIG. 2B is heated and, if desired, pressure is applied to encourage attachment of the integrated circuit 26 to the substrate 28. For example, for a conductive polymide media 27, heating may be in the range of about 250° C. to about 350° C. and applied pressure may be in the range of about 20 to about 40 gm/cm$^2$.

Figure 2C:
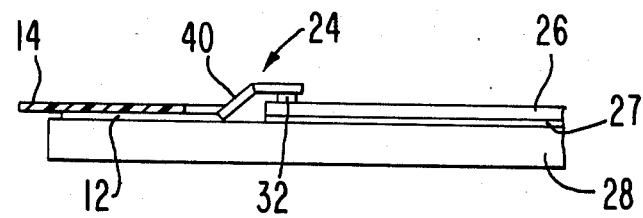

Conveniently, before the assembly of the substrate 28 and the die 26 is heated, the leads 12 will be formed downward and attached to the substrate 28, as illustrated in FIG. 2C. The outer portions of the leads 12 are attached to the substrate 28 by conventional means, typically using gold-tin reflow techniques. It is preferred to form the leads 12 and attached both the leads and the die 26 to the substrate 28 in a single step, although the order and manner of attaching the various components is not critical. Stretch loops 40 are provided in the inner portions 24 of each lead 12 to accommodate the downward movement of the leads 12 when attached to the substrate. Particularly preferable is the stretch loop configuration described in my previously referred to copending application.

Figure 2D:
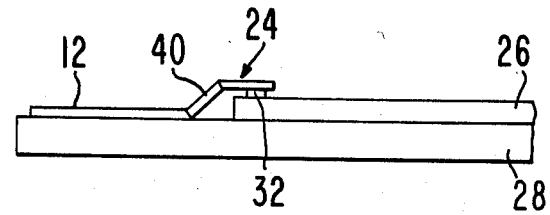

After the outer portions 12 have been attached to the substrate 28, the carrier film is excised, leaving the assembly shown in FIG. 2D.

An advantage of the use of the pre-attached conductive mounting media as described above is that the conventional die-attach steps dealing with liquid or paste are unnecessary. Thus, in combination with the tape automated bond of my previously preferred application, a packaging assembly is provided which is highly automated.

The pre-attached conductive mounting media structure and method of the present invention are generally applicable to integrated circuit packaging.

Figure 3A:
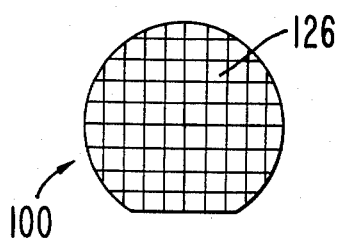
FIGS. 3A–3E are schematic views showing one form of integrated circuit assembly sequence to which the present invention relates.
Figure 3B:
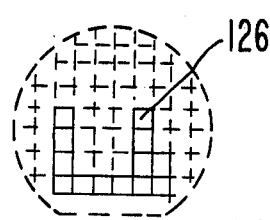
Figure 3C:
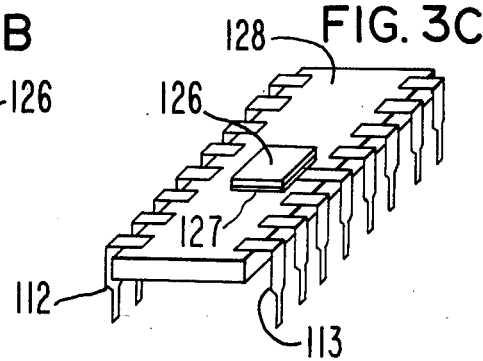
Figure 3D:
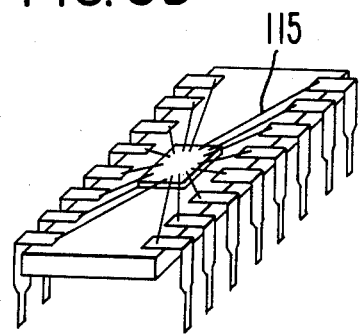
Figure 3E:
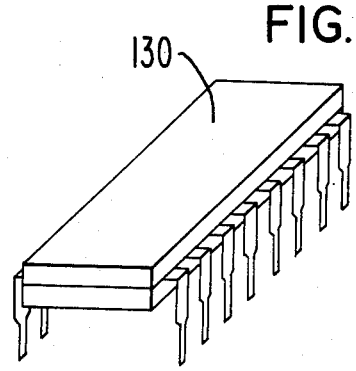

For example, in the conventional integrated circuit assembly sequence shown schematically in FIGS. 3A-3E, the integrated circuit can be provided with pre-attached conductive mounting media in accordance with the present invention. More particularly, as shown in FIG. 3A, a semiconductor wafer 100 is provided and includes a plurality of integrated circuits 126 therein. After testing the individual circuits 126, the circuits are separated, e.g., through sewing, as shown in FIG. 3B. Next, the individual circuits 126 are attached through their conductive mounting media 127 to a substrate 128 having a plurality of electrical contacts 112, 113, as shown in FIG. 3C. Next, leads 115 are provided for connecting the contacts 112, 113 to the corresponding contacts of the integrated circuit 126, as shown in FIG. 3D. Finally, the assembly is provided with encapsulation 130, as shown in FIG. 3E.

In accordance with one form of the present invention, a preferred manner of providing the pre-attached conductive mounting media 127 shown in FIG. 3C is to provide the media 127 to the rear surface of the wafer 100 such that, after the separating step shown in FIG. 3B, each individual circuit then includes the pre-attached conductive mounting media 127.

Figure 4:
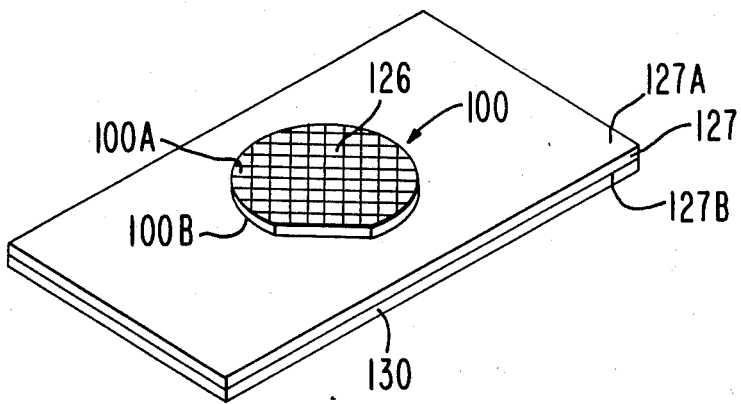
FIG. 4 is an isometric view showing one form of the present invention in which an electrically conductive tape is attached to a semiconductor wafer.

More particularly, as shown in FIG. 4, the rear major surface 100B of the wafer 100 (previously shown in FIG. 3A) is attached to a first major surface 127A of conductive mounting media 127 which is preferably in the form of a tape. Preferably, for ease of handling, the major surfaces 127A, 127B are each greater in area than the major surface 100B of the wafer 100. For ease of handling, it is desirable to have the other major surface 127B of the tape removably attached to a carrier film 130. Exemplary carrier films include materials such as polyolefine and poly-vinyl-chloride. Of course, the conductive tape 127 should exhibit a release characteristic wherein it is relatively more strongly attached to the wafer 100 and less strongly attached to the carrier film 130. When the structure shown in FIG. 4A is separated, e.g., sawed, each of the resulting integrated circuits 126 are provided with conductive mounting media attached thereto. That is, the remaining portion of conductive tape 127 is the conductive mounting media.

In the attaching of the tape 127 to the wafer 100, if the tape is a conductive polymide, it is generally desirable to apply sufficient heating to encourage a strong attachment as well as to cause the polyimide to develop a desired electrical conductivity. Typically, this heating may be in the range of about 250° C. to about 375° C.

While the present invention has been described with reference to specific embodiments thereof, it will be obvious to those skilled in the art that various changes and modifications may be made without departing from the invention in its broader aspects. It is contemplated in the appended claims to cover all variations and modifications of the invention which come within the true spirit and scope of my invention.

What is claimed as new and desired to be secured by Letters Patent of the United States is:

1. A semiconductor body comprising:
   an integrated circuit obtained from a semiconductor wafer, wherein a major surface of said integrated circuit consists of a portion of a major surface of said wafer; and an electrically conductive mounting medium attached to the major surface of said integrated circuit, said conductive mounting medium being obtained from an electrically conductive tape attached to the major surface of said wafer.

2. A semiconductor body as in claim 1, wherein said conductive tape comprises polymide.

3. A semiconductor body as in claim 2, wherein said conductive tape comprises a noble metal.

4. A semiconductor body as in claim 1, wherein said conductive tape comprises polymide and silver.

5. A method of attaching a conductive mounting media to an integrated circuit, comprising the steps of:
(a) providing a semiconductor wafer including a plurality of integrated circuits therein, said wafer having a pair of opposing major surfaces, one of the surfaces including a plurality of electrical contacts for each of the integrated circuits;
(b) attaching the other of the major surfaces of the wafer to a first major surface of a preformed electrically conductive tape; and
(c) separating individual ones of the integrated circuits wherein each of said individual ones includes conductive mounting media attached thereto with said media comprising a portion of the electrically conductive tape.

6. A method in accordance with claim 5 in which the electrically conductive tape includes a second major surface which is removably attached to a carrier film.

7. A method in accordance with claim 6 in which the conductive tape has a release characteristic wherein it is relatively more strongly attached to the first major surface of the wafer and less strongly attached to the carrier film.

8. A method in accordance with claim 6 in which the conductive tape comprises polymide.

9. A method in accordance with claim 6 in which the conductive tape comprise polymide and a noble metal.

10. A method in accordance with claim 5 in which the step of separating individual ones of the integrated circuits comprises sawing.

11. A method in accordance with claim 8 which includes the step of curing the polymide to obtain a predetermined resistivity.

12. A method in accordance with claim 6 in which the carrier film comprises polyolefine.

13. A method in accordance with claim 6 in which the carrier film comprises poly-vinyl-chloride.

14. A method in accordance with claim 5 in which the major surfaces of the tape are each greater in area than the other major surface of the semiconductor wafer.

15. A method in accordance with claim 14 which includes the step of attaching the individual ones of the integrated circuits to a substrate through the conductive media attached thereto.

16. A method in accordance with claim 15 in which the substrate comprises an insulating material.

17. A method in accordance with claim 16 in which the substrate comprises aluminum oxide.

18. A method in accordance with claim 15 in which the substrate comprises a conducting material.

19. An integrated circuit made by the method of claim 5.

* * * * *